(12) United States Patent
Huang

(10) Patent No.: US 11,056,576 B1
(45) Date of Patent: Jul. 6, 2021

(54) METHOD OF MANUFACTURING SEMICONDUCTOR DEVICE

(71) Applicant: NANYA TECHNOLOGY CORPORATION, New Taipei (TW)

(72) Inventor: Chih-Wei Huang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/778,924

(22) Filed: Jan. 31, 2020

(51) Int. Cl.
*H01L 29/66* (2006.01)
*H01L 21/8234* (2006.01)
*H01L 29/423* (2006.01)

(52) U.S. Cl.
CPC ........... *H01L 29/66734* (2013.01); *H01L 21/823487* (2013.01); *H01L 29/4236* (2013.01)

(58) Field of Classification Search
None
See application file for complete search history.

(56) References Cited

U.S. PATENT DOCUMENTS

2013/0153995 A1* 6/2013 Misawa .............. H01L 29/7813
257/330

* cited by examiner

*Primary Examiner* — Hsien Ming Lee
(74) *Attorney, Agent, or Firm* — Muncy, Geissler, Olds & Lowe, P.C.

(57) ABSTRACT

The present disclosure provides a method of manufacturing a semiconductor device. The method includes steps of creating at least one trench in a substrate; forming a dielectric film on the substrate in the trench; depositing a first conductive layer on the dielectric film to partially fill the trench; depositing an insulative film on the first conductive layer; depositing a second conductive layer to bury the insulative film; and recessing the first conductive layer, until the insulative film is entirely removed. Due to the deposition of the insulative film on the first conductive layer, the etch depth of the superfluous first conductive layer can be accurately controlled.

12 Claims, 14 Drawing Sheets

METHOD OF MANUFACTURING SEMICONDUCTOR DEVICE

TECHNICAL FIELD

The present disclosure relates to a method of manufacturing a semiconductor device, and more particularly, to a method of manufacturing a recessed access device (RAD) transistor.

DISCUSSION OF THE BACKGROUND

Manufacture of various semiconductor devices, such as memory devices, logic devices and microprocessors, has the common goal of miniaturization. As feature sizes decrease, the electrical operation of the transistor becomes more difficult. One contributing factor to such difficulty, the short-channel effect, arises when the width of the transistor channel becomes excessively small due to miniaturization. This may result in the transistor activating even though a threshold voltage (Vt) has not been applied to the gate.

A new type of transistor, known as a recessed access device (RAD) transistor, has been developed to overcome the short-channel effect suffered by conventional transistors by forming a wider channel in the same horizontal space. The RAD transistor comprises a transistor gate (word line) that is partially formed within a trench in a semiconductor wafer. The channel region is formed along the entire surface of the trench, thereby providing a wider channel without increasing the amount of lateral space required by the transistor. However, with increases in DRAM bit density, the overlay between transistor gates and the source/drain junction depth create a challenge due to variations in the etching process.

In order to precisely control the etch depth of the trench, the etching process must be closely monitored by periodically interrupting it to measure the etched depth in the semiconductor wafer and estimating the etching process time remaining to reach the target depth based on the elapsed etching process time. However, the estimation of remaining etching time to reach the desired depth is based on an assumption that the etching rate remains consistent, and therefore produces an unreliable estimate. The problems of such a cumbersome procedure include low productivity and high cost as well as increased opportunity for introduction of contamination or faults in the photoresist pattern.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a method of manufacturing a semiconductor device. The method includes steps of creating at least one trench in a substrate; forming a dielectric film on the substrate in the trench; depositing a first conductive layer on the dielectric film to partially fill the trench; depositing an insulative film on the first conductive layer, wherein the insulative film, in the trench, is surrounded by the first conductive layer; depositing a second conductive layer on the insulative film, wherein the second conductive layer, in the trench, is surrounded by the insulative film; and recessing the first conductive layer, until the insulative film is entirely removed, to form at least one word line.

In some embodiments, a top surface of the word line is lower than an upper surface of the substrate.

In some embodiments, the method further includes a step of introducing dopants into the substrate to form a plurality of impurity regions separated by the trench.

In some embodiments, the method further includes a step of depositing a capping layer to cover the word line.

In some embodiments, the creating of the trench includes steps of forming a sacrificial layer over the substrate; creating at least one opening penetrating through the sacrificial layer; and etching the substrate through the opening to form the trench.

In some embodiments, the sacrificial layer is removed after the deposition of the capping layer.

In some embodiments, the method further includes steps of forming a buffer layer on the substrate before the forming of the sacrificial layer, and removing the buffer layer after the sacrificial layer is removed, wherein the dielectric film and the buffer layer comprise the same material.

In some embodiments, the second conductive layer is entirely removed concurrent with the recessing of the first conductive layer.

In some embodiments, the method further includes steps of depositing a diffusion barrier layer on the dielectric film before the deposition of the first conductive layer, and recessing the diffusion barrier layer below a top surface of the word line after the recessing of the first conductive layer.

In some embodiments, the second conductive layer completely fills the trench.

In some embodiments, the dielectric film is exposed through the substrate and the capping layer after the word line is form.

In some embodiments, the first conductive layer and the second conductive layer comprise the same material.

With the above-mentioned methods of manufacturing the semiconductor device, the etch depth of the superfluous first conductive layer can be accurately controlled, and therefore the quality of the semiconductor device can be improved.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
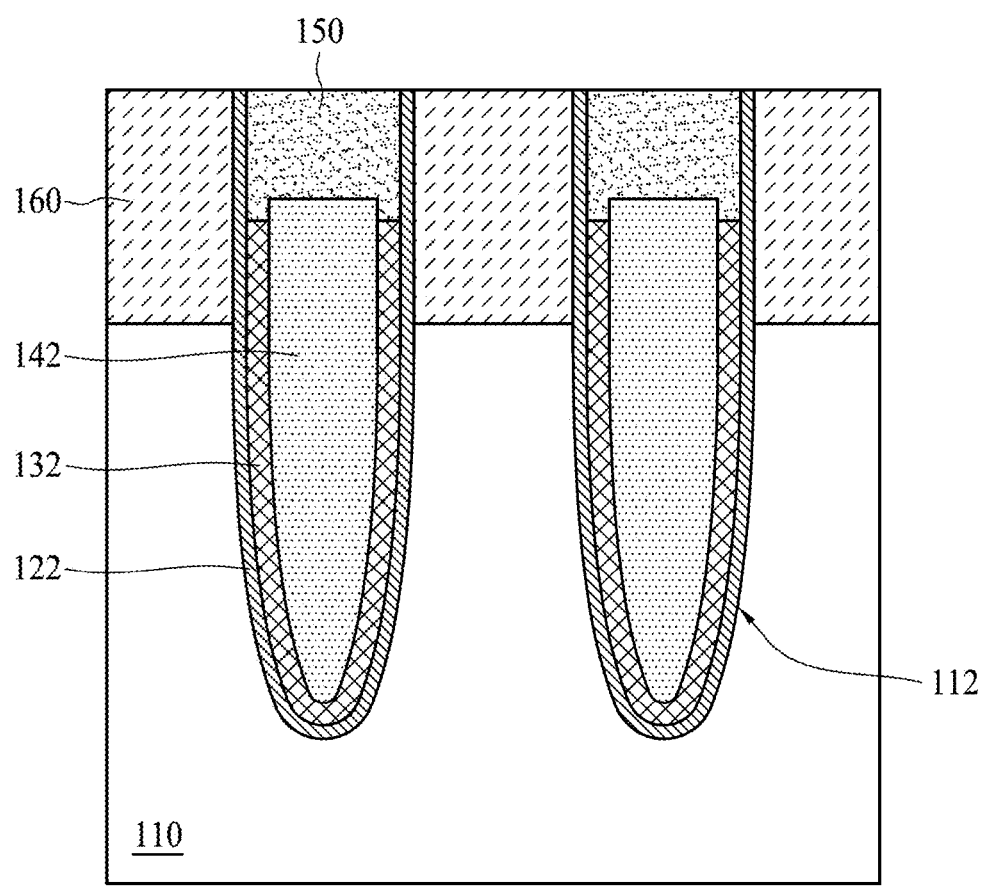
FIG. 1 is a cross-sectional view of a semiconductor device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a cross-sectional view of a semiconductor device in accordance with some embodiments of the present disclosure. Referring to FIG. 1, the semiconductor device 10 is a recessed access device (RAD) transistor including a substrate 110, one or more word lines 142 disposed in the substrate 110 and surrounded by dielectric liners 122, and a plurality of impurity regions 160 disposed in the substrate 110 and on either side of the word lines 142. The word lines 142 are shielded from the impurity regions 160 by the dielectric liners 122 therebetween, thereby preventing dopants introduced in the impurity regions 160 from migrating into the word lines 142.

The semiconductor device 10 further includes a capping layer 150 covering the word lines 142 and surrounded by the dielectric liners 122. The dielectric liners 122 and the capping layer 150 are exposed through the substrate 110, and the word lines 142 are entirely embedded in the capping layer 150. The semiconductor device 10 may also include diffusion barrier liners 132 disposed between the dielectric liners 122 and the word lines 142 to prevent the word lines 142 from flaking or spalling from the dielectric liner 122.

Figure 2:
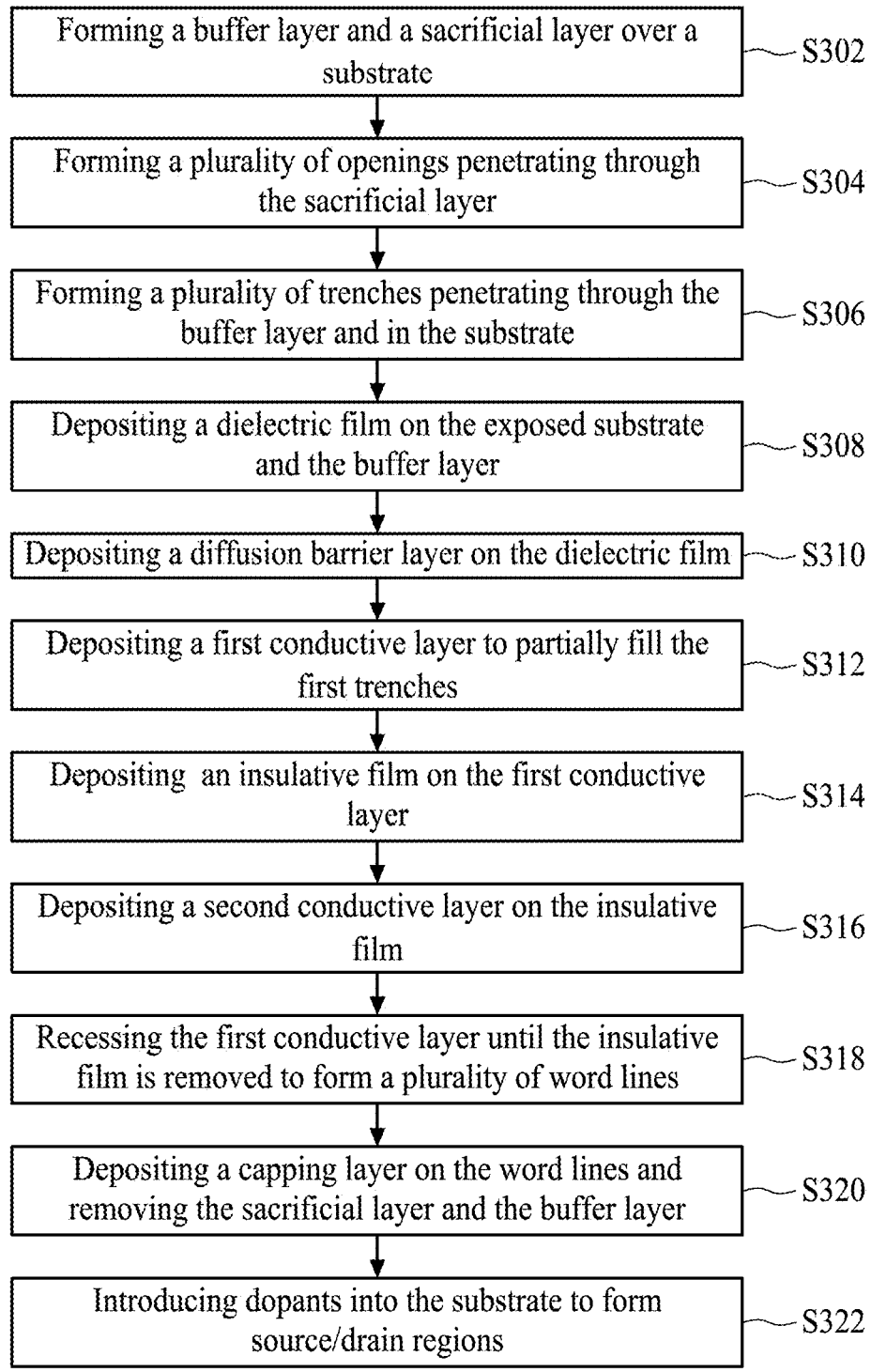
FIG. 2 is a flow diagram illustrating a method of manufacturing a semiconductor device in accordance with some embodiments of the present disclosure.

FIG. 2 is a flow diagram illustrating a method 300 of manufacturing a semiconductor device in accordance with some embodiments of the present disclosure, and FIGS. 3 through 14 illustrate cross-sectional views of intermediate stages in the formation of a semiconductor device in accordance with some embodiments of the present disclosure. The stages shown in FIGS. 3 to 14 are also illustrated schematically in the flow diagram in FIG. 2. In the subsequent discussion, the fabrication stages shown in FIGS. 3 to 14 are discussed in reference to the process steps shown in FIG. 2.

Figure 3:
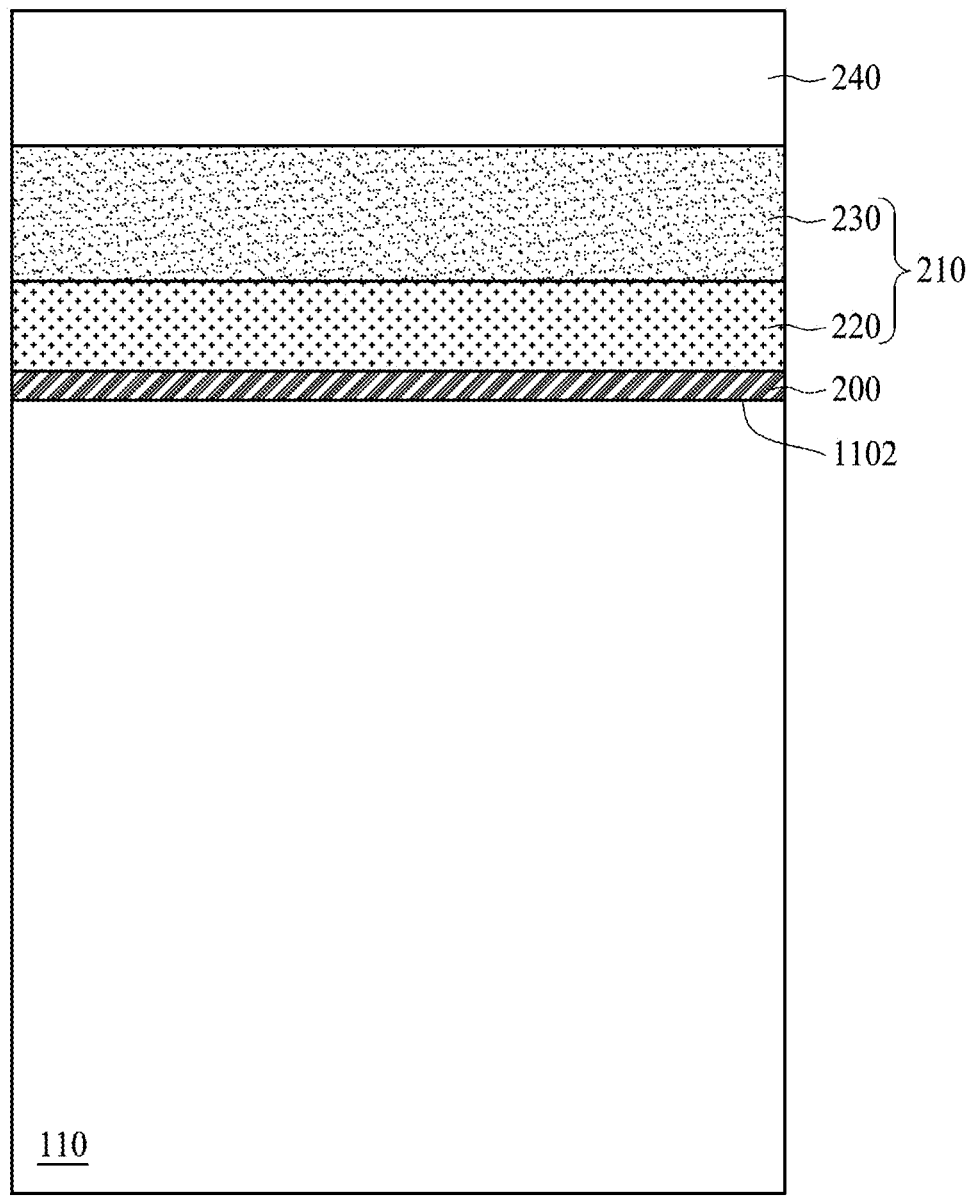
FIGS. 3 through 14 illustrate cross-sectional views of intermediate stages in the formation of a semiconductor device in accordance with some embodiments of the present disclosure.

Referring to FIG. 3, a buffer layer 200 and a sacrificial layer 210 are stacked on a substrate 110 according to a step S302 in FIG. 2. The substrate 110 is preferably made of semiconductor material; in some embodiments, the substrate 110 is formed of silicon-containing material. The buffer layer 200, formed on the entire upper surface 1102 of the substrate 110, protects against contamination and mitigates stress at the interface between the substrate 110 and the sacrificial layer 210. The buffer layer 200 can include silicon oxide or silicon dioxide. The buffer layer 200 is formed using a chemical vapor deposition (CVD) process or a thermal oxidation process. In other words, the buffer layer 200 can be a deposition layer or an oxidized layer, wherein the thermally grown oxides can display a higher level of purity than the deposited oxides.

The sacrificial layer 210 may include an underlying layer 220 and an overlying layer 230 sequentially deposited on the buffer layer 200, wherein the underlying layer 220 and the overlying layer 230 function as hard masks for patterning the buffer layer 200 and the substrate 110. In addition, the overlying layer 230 is employed as an anti-reflective coating (ARC) layer to minimize the optical reflection of the radiation used to expose a photoresist layer 240 coated on the overlying layer 230. In some embodiments, the underlying layer 220, including polysilicon, is formed using a CVD process. The overlying layer 230 may be formed of an inorganic material, including nitride, using a CVD process, a physical vapor deposition (PVD) process, a spin-coating process or an atomic layer deposition (ALD) process. The photoresist layer 240 is applied over the sacrificial layer 210 by a spin-coating process and then dried using a soft-baking process.

Figure 4:
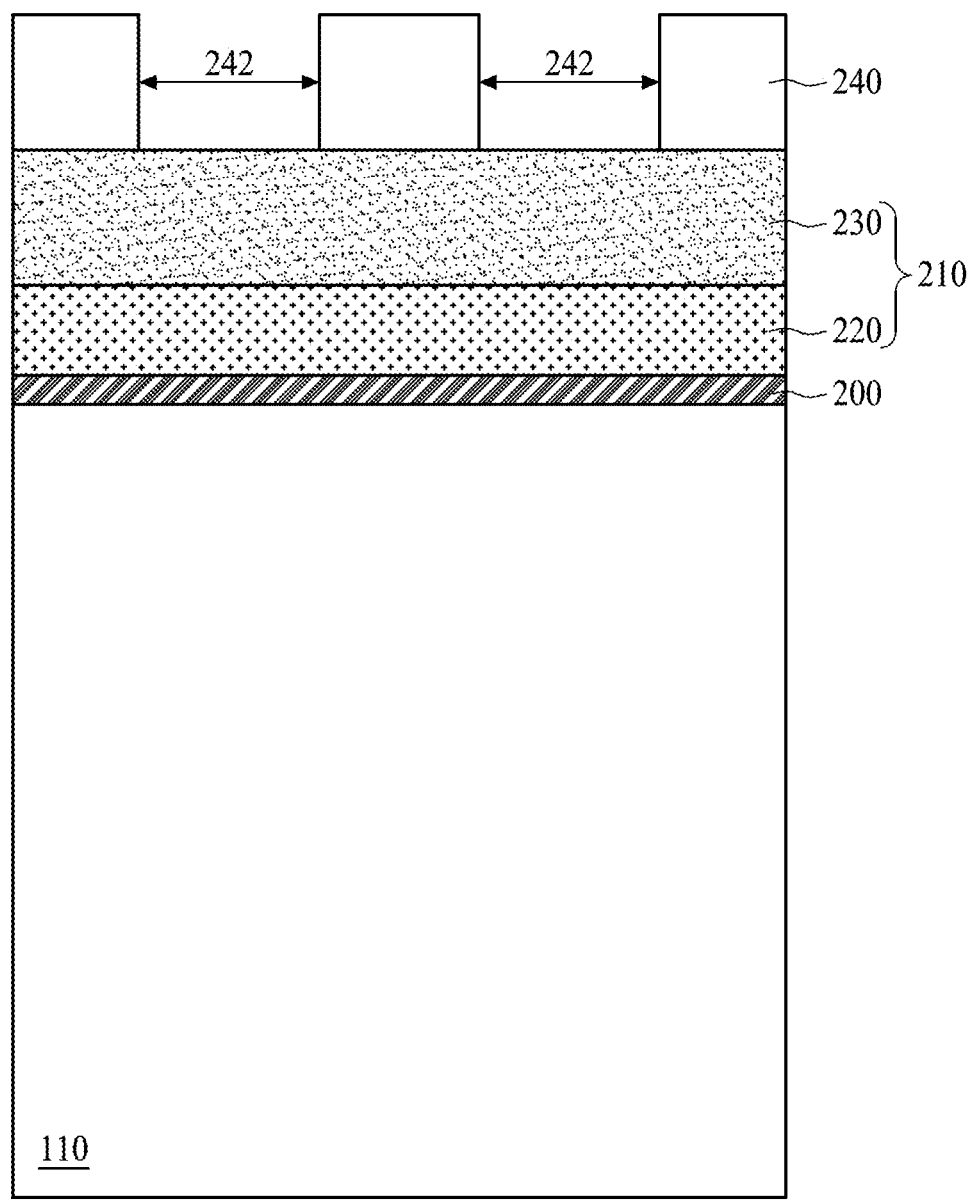
Figure 5:
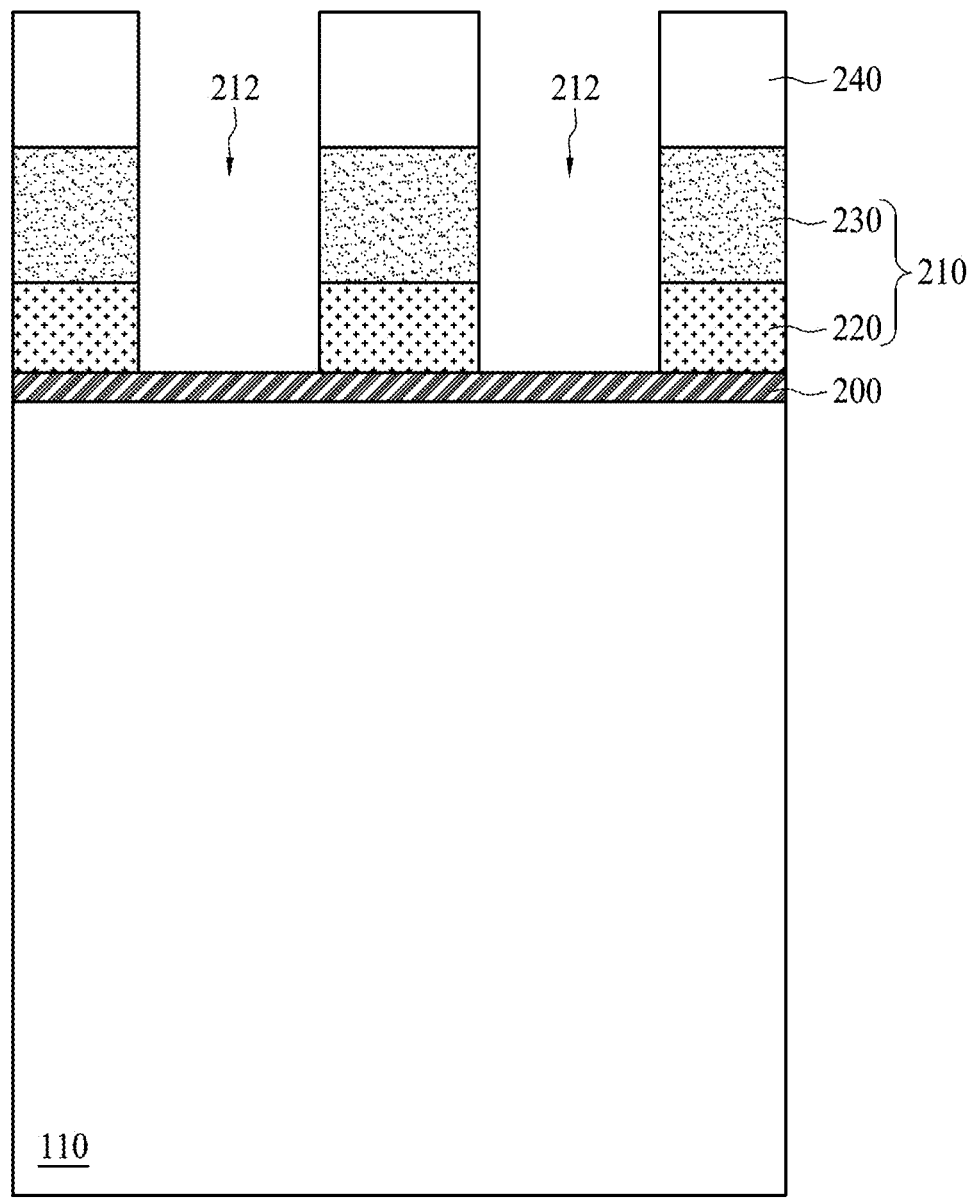

Referring to FIG. 4, the photoresist layer 240 is exposed and developed to form one or more windows 242 to expose portions of the overlying layer 230. Next, the overlying layer 230 and the underlying layer 220 are etched through the windows 242 to form one or more openings 212 penetrating through the sacrificial layer 210 according to a step S304 in FIG. 2. Consequently, portions of the buffer layer 200 are exposed, as shown in FIG. 5. Referring to FIGS. 4 and 5, the openings 212 are formed in the sacrificial layer 210 using at least one etching process to remove portions of the overlying layer 230 and the underlying layer 220 not protected by the photoresist layer 240. In should be noted that the etching process may utilize multiple etchants, selected based on the materials of the underlying layer 220 and the overlying layer 230, to etch the sacrificial layer 210. In some embodiments, the buffer layer 200 may serve as an etch stop layer during the performing of the etching process.

Figure 6:
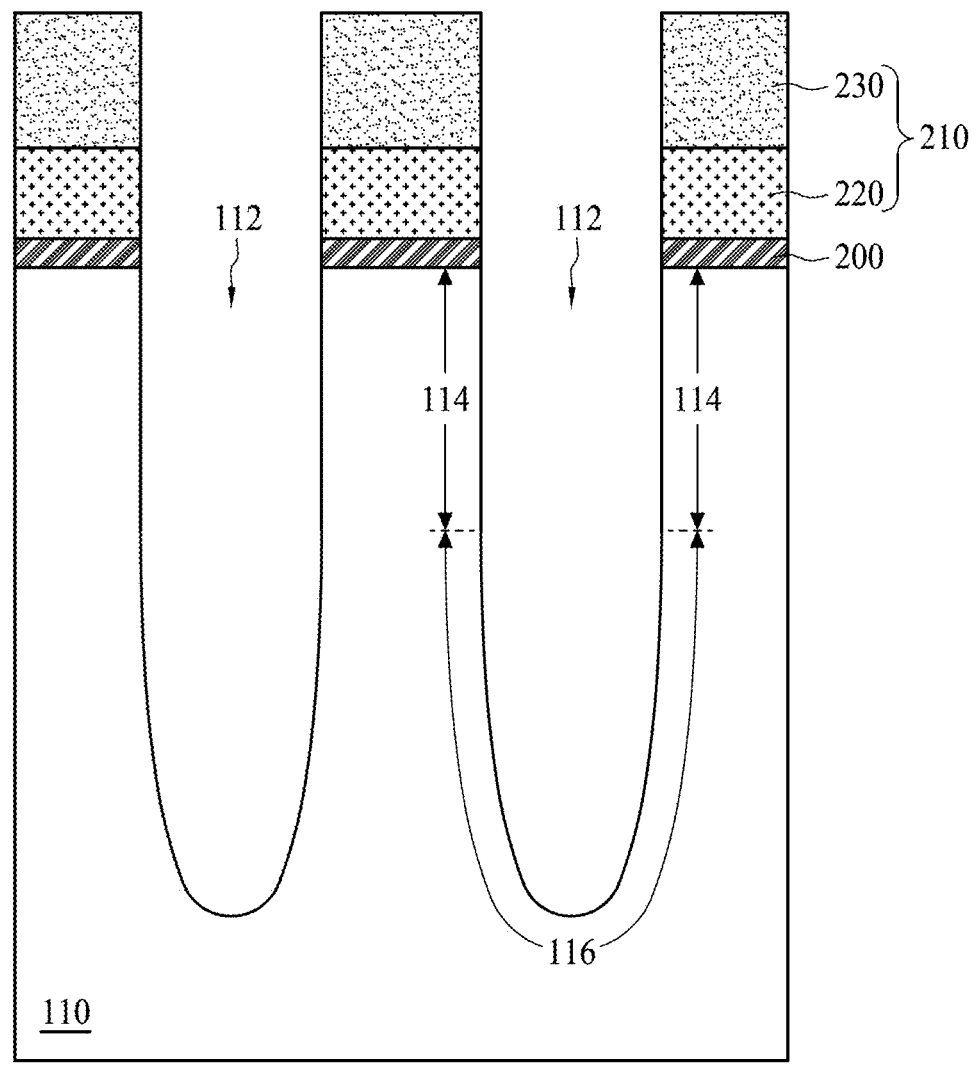

Referring to FIG. 6, after the openings 212 are formed, the photoresist layer 240 is removed using an ashing process or a strip process, for example. Next, the buffer layer 200 and the substrate 110 are sequentially etched through the openings 212 to form one or more trenches 112 penetrating through the buffer layer 200 and extending into the substrate 110 according to a step S306 in FIG. 2. The substrate 110 and the buffer layer 200 are anisotropically dry-etched, using a reactive ion etching (RIE) process, for example, through the openings 212 to form the trenches 112 in the substrate 110, so that the width in the opening 212 is maintained in the trenches 112. In some embodiments, bottoms of the trenches 112 may be rounded to reduce defect density and lower electric field concentration during the operating of the device.

As shown in FIG. 6, the trench 112 can include an upper segment 114, proximal to the sacrificial layer 210 and having a uniform width, and a lower segment 116, away from the sacrificial layer 210 and having a tapering width. In other words, the sidewall of the substrate 110 in the upper segment 114 of the trench 112 is substantially a vertical plane, while the sidewall of the substrate 110 in the lower segment 116 of the trench 112 is a sloped surface, which transitions into the vertical plane. In some embodiments, the upper segment 114 of the trench 112 is wider than the bottom segment 116 thereof.

Figure 7:
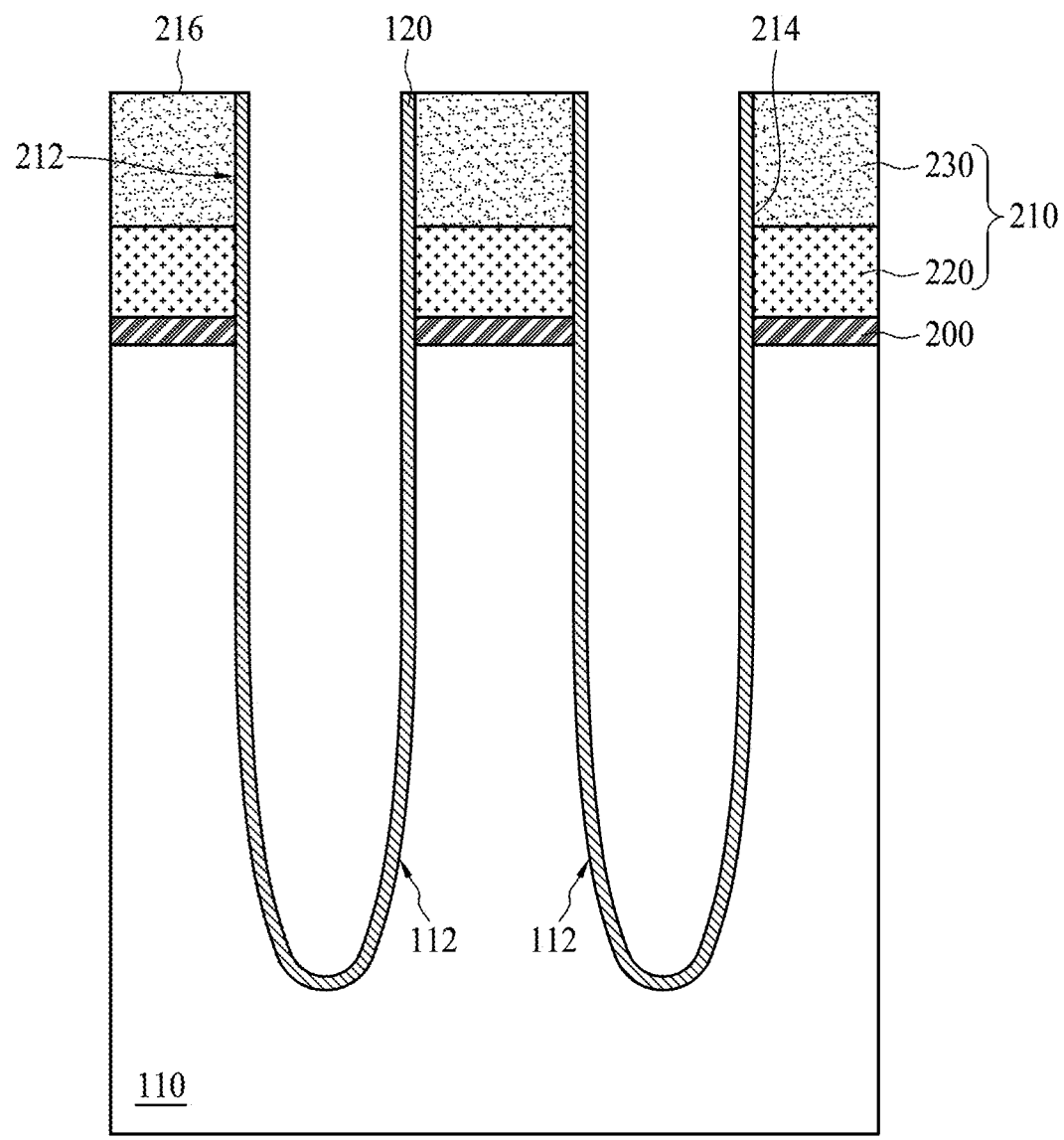

Referring to FIG. 7, a dielectric film 120 is formed on an exposed portion of the substrate 110 according to a step S308 in FIG. 2. The dielectric film 120, having a substantially uniform thickness, covers the exposed portion of the substrate 110, but does not fill the trench 112. In some embodiments, the dielectric film 120 and the buffer layer 200 can include the same material, but the present disclosure is not limited thereto. In some embodiments, the dielectric film 120 may be grown on the exposed portion of the substrate 110 using a thermal oxidation process. In alternative embodiments, the dielectric film 120 is disposed not only on the exposed portion of the substrate 110 but also on an exposed portion of the sacrificial layer 210. By way of example, the dielectric film 120 includes oxide, nitride, oxynitride or high-k material and can be deposited using a CVD process, an ALD process, or the like. In some embodiments, the dielectric film 120 deposited on a topmost surface 216 of the sacrificial layer 210 may be removed using an etching process, for example, while the dielectric film 120 deposited on the sidewalls 214 is left in place.

Figure 8:
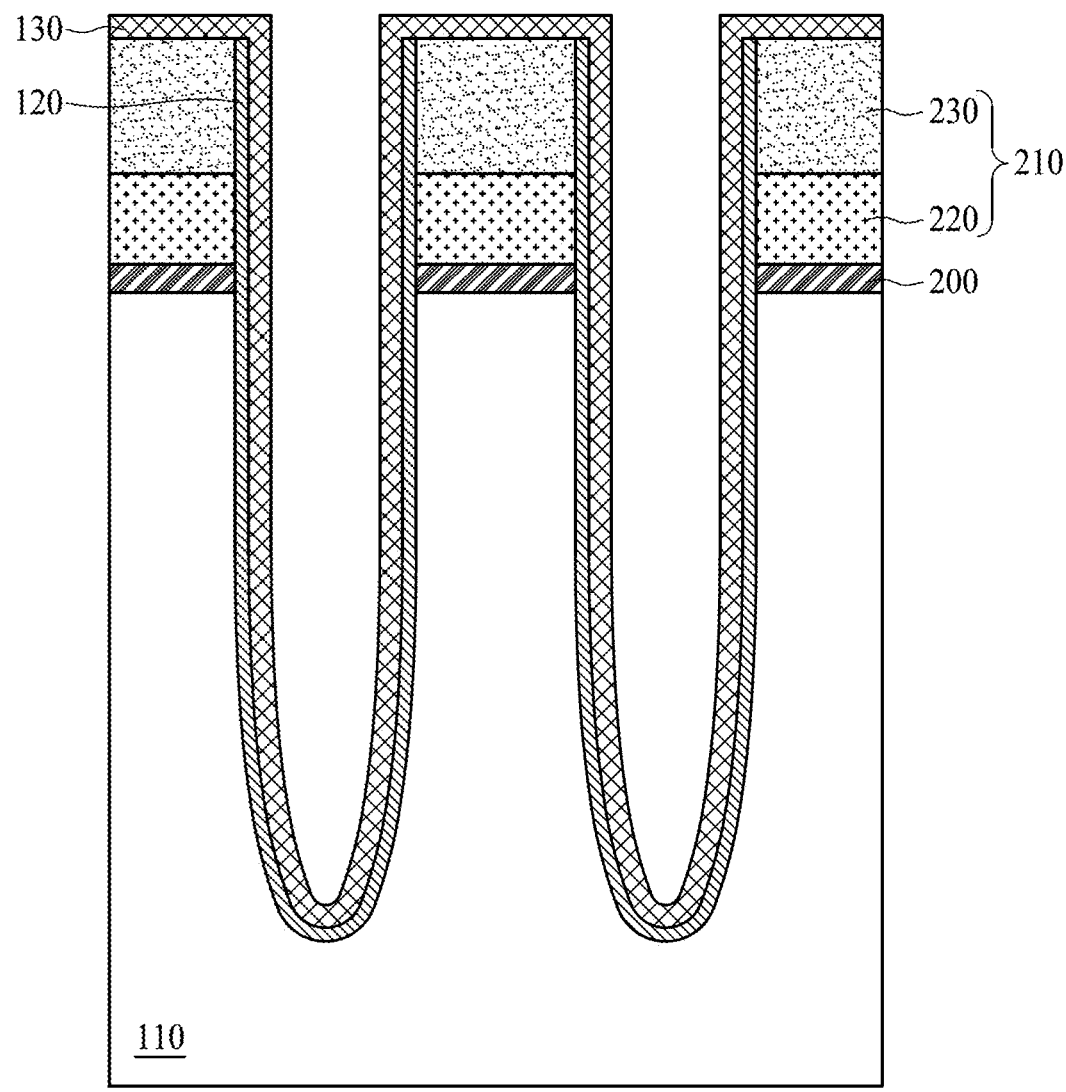

Referring to FIG. 8, a diffusion barrier layer 130 is optionally deposited on the dielectric film 120 according to a step S310 in FIG. 2. The diffusion barrier layer 130 may further be deposited on the portion of the sacrificial layer 210 exposed through the dielectric film 120. The diffusion barrier layer 130, having a substantially uniform thickness, covers the dielectric film 120, but does not fill the trench 112. In order to secure the step coverage, the diffusion barrier layer 130 can be formed using a PVD process or an ALD process, for example, wherein the diffusion barrier layer 130 deposited using the ALD process is highly uniform in thickness. In some embodiments, the diffusion barrier layer 130 may be a single-layered structure including refractory metals (such as tantalum and titanium), refractory metal nitrides, or refractory metal silicon nitrides. In alternative embodiments, the diffusion barrier layer 130 may comprise a multi-layered structure including one or more refractory metals, refractory metal nitrides, or refractory metal silicon nitrides.

Figure 9:
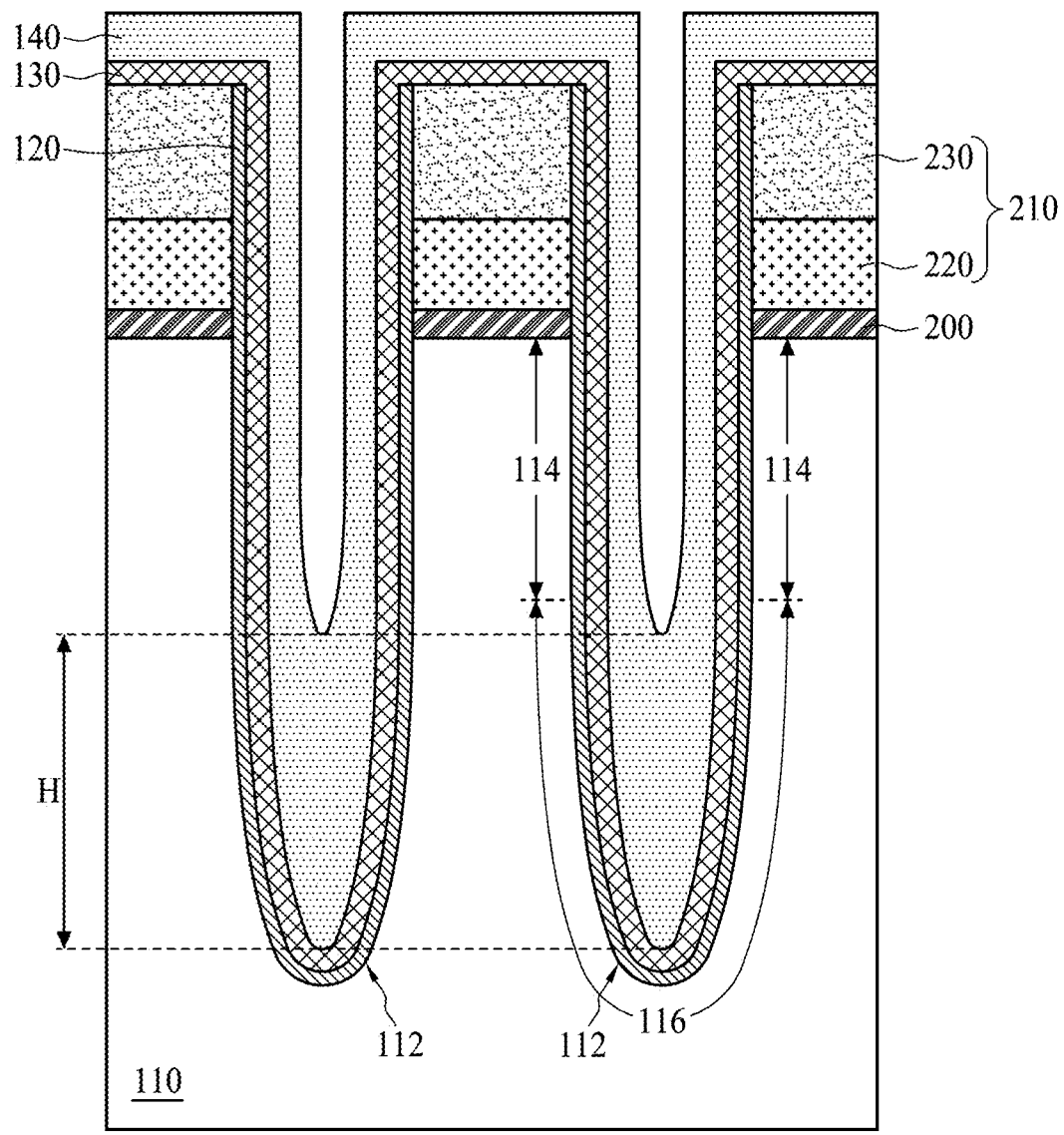

Referring to FIG. 9, a first conductive layer 140 is deposited to partially fill the trench 112 according to a step S312 in FIG. 2. The first conductive layer 140 is conformally and uniformly deposited over the dielectric film 120. Due to the directionality in the deposition of the first conductive layer 140 toward the bottom of the trench 112, the rate of deposition of the first conductive layer 140 at the lower segment 116 of the trench 112 is greater than the rate of deposition of the first conductive layer 140 at the upper segment 114 of the trench 112. As a result, the thickness of the first conductive layer 140 at the lower segment 116 of the trench 112 is significantly greater than the thickness of the first conductive layer 140 at upper segment 114 of the trench 112. In some embodiments, the deposition of the first conductive layer 140 stops when the first conductive layer 140 deposited in the trench 112 reaches a predetermined thickness H, which can circumvent the detrimental short-channel effect and improve the device reliability. The first conductive layer 140 includes polysilicon or metal, such as tungsten, aluminum, copper, molybdenum, titanium, tantalum, ruthenium, or a combination thereof. The first conductive layer 140 may be formed using a CVD process, a PVD process, an ALD process or another suitable process.

Figure 10:
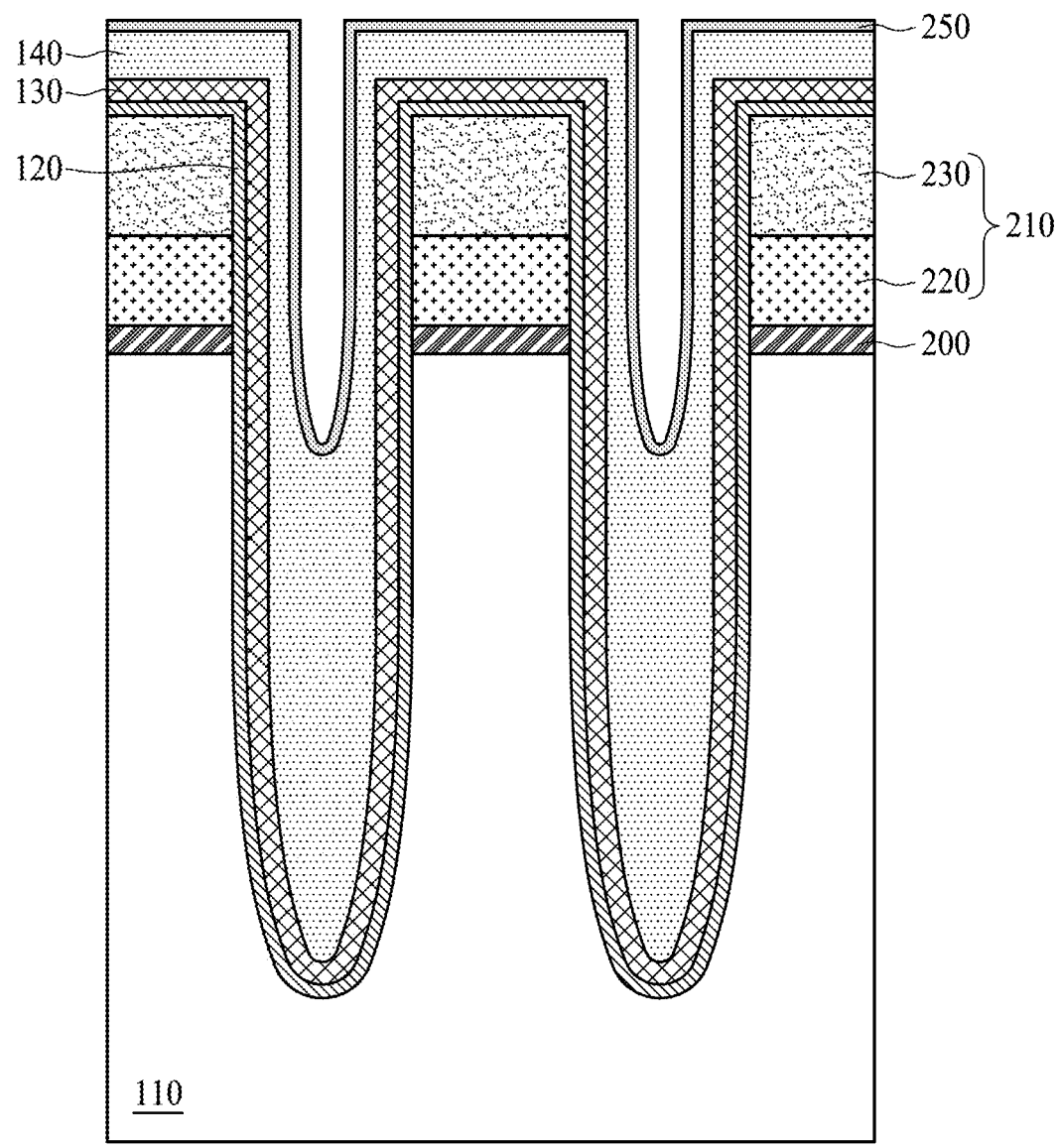

Referring to FIG. 10, an insulative film 250 is deposited on the first conductive layer 140 according to a step S314 in FIG. 2. The insulative film 250, having a substantially uniform thickness, covers the first conductive layer 140, but does not fill the trench 112. The insulative film 250 may include nitride and is formed using a (plasma) CVD process.

Figure 11:
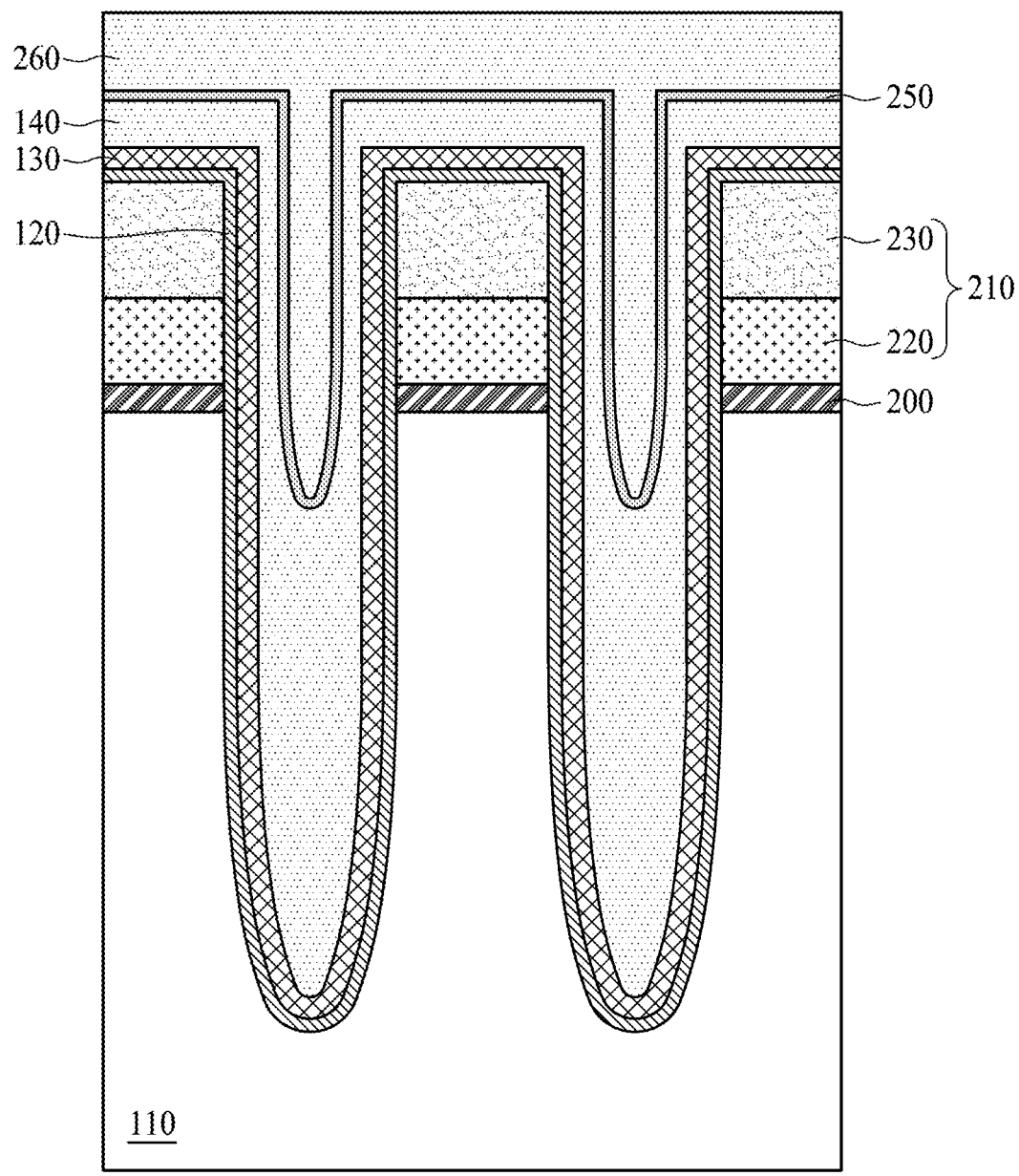

Referring to FIG. 11, a second conductive layer 260 is disposed to fill the trench 112 according to a step S316 in FIG. 2. Consequently, the insulative film 250 is embedded in the second conductive layer 260. The second conductive layer 260 may include polysilicon or metal, such as tungsten, aluminum, copper, molybdenum, titanium, tantalum, ruthenium, or a combination thereof, and is formed using a CVD process, a PVD process or an ALD process. In some embodiments, the first conductive layer 140 and the second conductive layer 260 can include the same material, but the present disclosure is not limited thereto.

Figure 12:
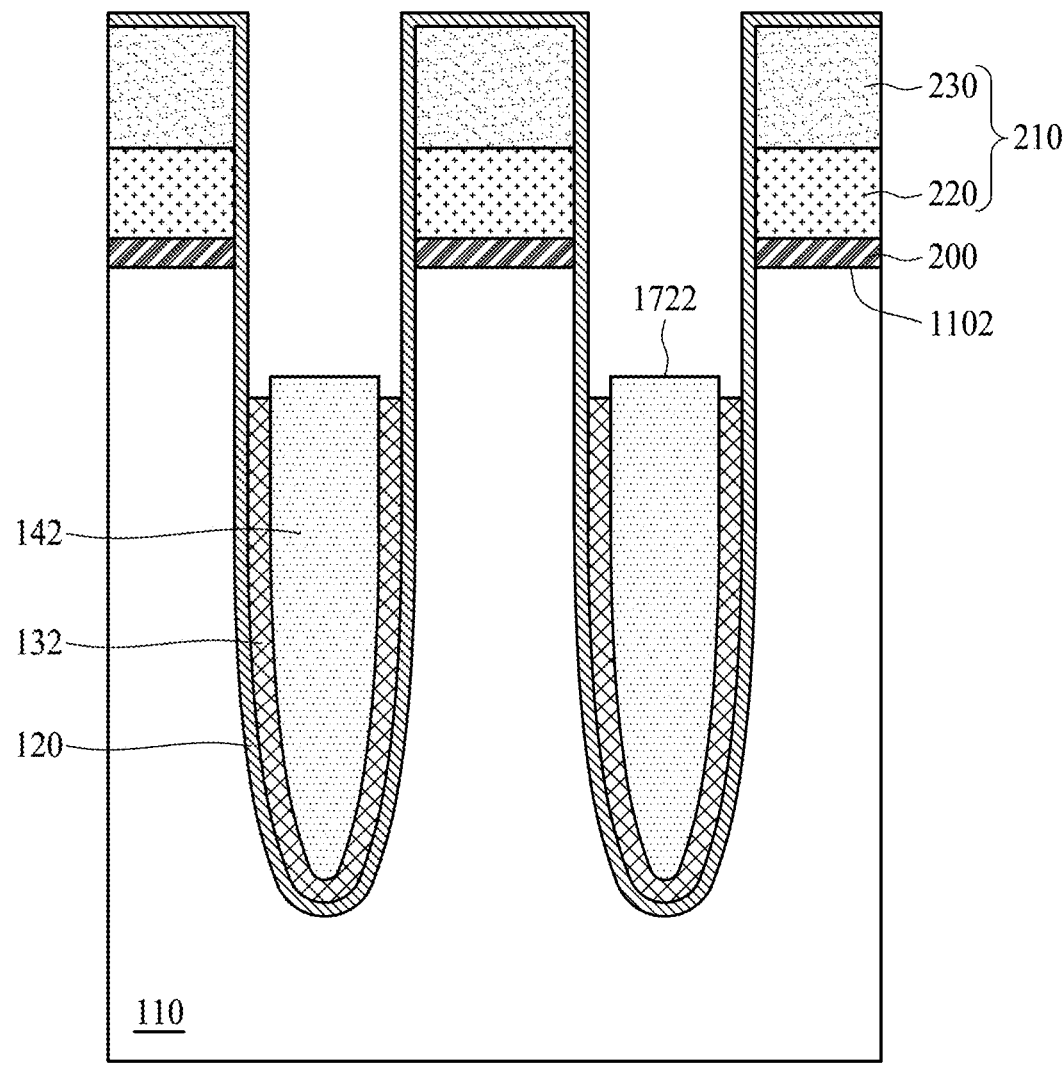

Referring to FIG. 12, the first conductive layer 140 is recessed below the upper surface 1102 of the substrate 110 according to a step S318 in FIG. 2. Consequently, a plurality of word lines 142 are formed. The insulative film 250 and the second conductive layer 260, employed to maintain a desired etch rate during the recessing of the first conductive layer 140, are entirely removed, using an RIE process, for example. The formation of the word lines 142 includes (1) exposing portions of the insulative film 250 embedded in the second conductive layer 260 by partially removing the second conductive layer 260 (and a portion of the insulative film 250) using an etching process or a polishing process, and (2) removing the second conductive layer 260, the insulative film 250 and the first conductive layer 140 until the material in the insulative film 250 is no longer released into the etching chamber. In other words, the removal of the superfluous first conductive layer 140 stops when the insulative film 250 is entirely removed. In some embodiments, the end point of the removal of the superfluous first conductive layer 140 is accurately determined by in-situ monitoring of the change in the intensity of the optical emission of the spectral line from one of the etch product species using optical emission spectroscopy.

After the word lines 142 are completely formed, the diffusion barrier layer 130 is recessed below a top surface 1722 of the word lines 142. Consequently, a plurality of the diffusion barrier liners 132 are formed.

Figure 13:
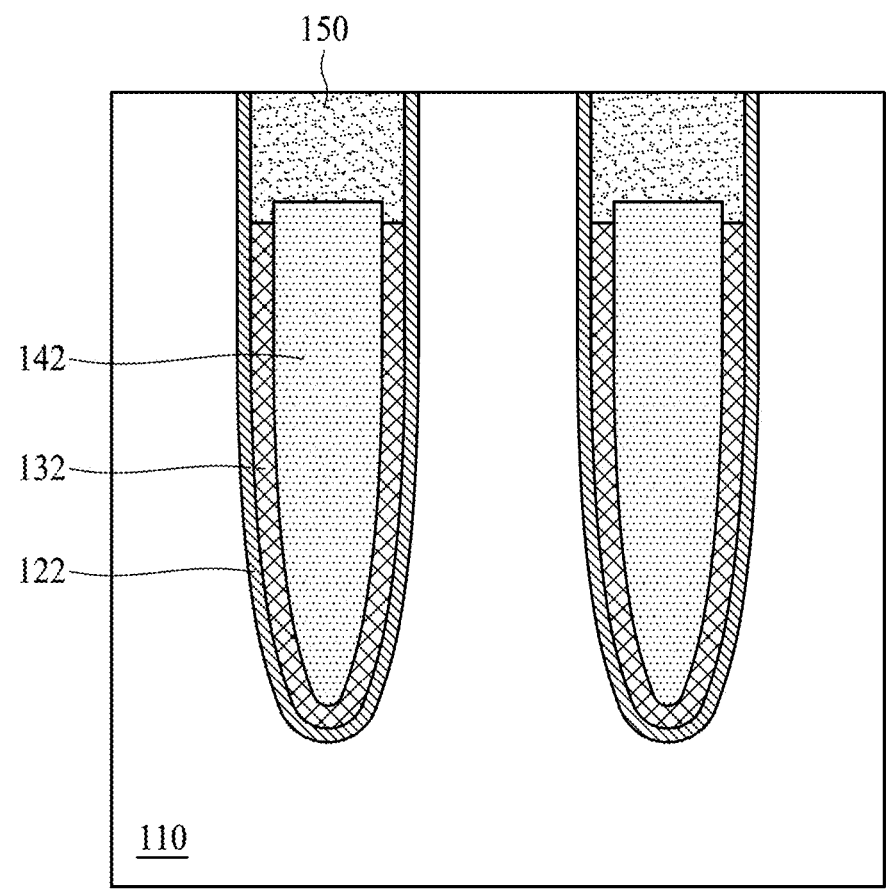

Referring to FIG. 13, a capping layer 150 is deposited to cover the word lines 142 and the diffusion barrier liners 132 according to a step S320 in FIG. 2. The capping layer 150 functions as a passivation layer for protecting the word lines 142 and the diffusion barrier liners 132. After the deposition of the capping layer 150, one or more removal process, including etching process and/or polishing process, are performed to remove the superfluous capping layer 150, the sacrificial layer 210, the buffer layer 200, and the portion of the dielectric layer 120 coated on the buffer layer 200 and the sacrificial layer 210, thereby exposing the substrate 110 and forming dielectric liners 122.

Figure 14:
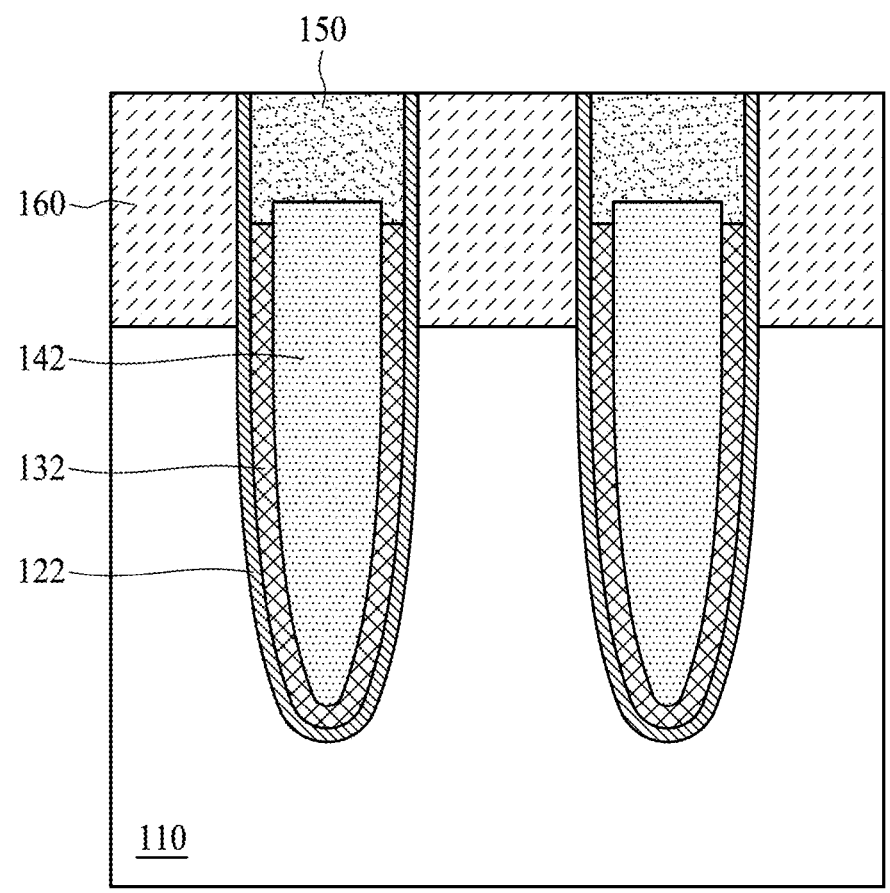

Referring to FIG. 14, dopants are introduced into the substrate 110 to form impurity regions 160 on either side of the word lines 142 according to a step S322 in FIG. 2. Accordingly, the semiconductor device 10 is completely formed. The impurity regions 160 can serve as source/drain regions of the transistor. The introduction of the dopants into the substrate 110 is achieved by a diffusion process or an ion-implantation process. The dopant introduction may be performed using boron or indium if the respective transistor is a p-type transistor, or using phosphorous, arsenic, or antimony if the respective transistor is an n-type transistor.

In conclusion, the method of the present disclosure deposits the insulative film 250 on the first conductive layer 140 to accurately control the etch depth. This avoids a timed etch in which a controlled etch depth is difficult to achieve repeatedly, and therefore the quality of the semiconductor device 10 can be improved.

One aspect of the present disclosure provides a method of manufacturing a semiconductor device. The method comprises steps of creating at least one trench in a substrate; forming a dielectric film on the substrate in the trench; depositing a first conductive layer on the dielectric film to partially fill the trench; depositing an insulative film on the first conductive layer, wherein the insulative film, in the trench, is surrounded by the first conductive layer; depositing a second conductive layer on the insulative film, wherein the second conductive layer, in the trench, is surrounded by the insulative film; and recessing the first conductive layer, until the insulative film is entirely removed, to form at least one word line.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method of manufacturing a semiconductor device, comprising:
   creating at least one trench in a substrate;
   forming a dielectric film on the substrate in the at least one trench;
   depositing a first conductive layer on the dielectric film to partially fill the at least one trench;
   depositing an insulative film on the first conductive layer, wherein the insulative film, in the at least one trench, is surrounded by the first conductive layer;
   depositing a second conductive layer on the insulative film, wherein the second conductive layer, in the at least one trench, is surrounded by the insulative layer; and
   recessing the first conductive layer, until the insulative film is entirely removed, to form at least one word line.

2. The method of claim 1, wherein a top surface of the word line is lower than an upper surface of the substrate.

3. The method of claim 1, further comprising introducing dopants into the substrate to form a plurality of impurity regions separated by the at least one trench.

4. The method of claim 1, further comprising depositing a capping layer to cover the word line.

5. The method of claim 4, wherein the creating of the at least one trench comprises:
   forming a sacrificial layer over the substrate;
   creating at least one opening penetrating through the sacrificial layer; and
   etching the substrate through the at least one opening to form the at least one trench.

6. The method of claim 5, wherein the sacrificial layer is removed after the deposition of the capping layer.

7. The method of claim 5, further comprising:
   forming a buffer layer on the substrate before the forming of the sacrificial layer, and
   removing the buffer layer after the sacrificial layer is removed, wherein the dielectric film and the buffer layer comprise the same material.

8. The method of claim 1, wherein the second conductive layer is entirely removed concurrent with the recessing of the first conductive layer.

9. The method of claim 1, further comprising:
   depositing a diffusion barrier layer on the dielectric film before the deposition of the first conductive layer; and
   recessing the diffusion barrier layer below a top surface of the word line after the recessing of the first conductive layer.

10. The method of claim 1, wherein the second conductive layer completely fills the at least one trench.

11. The method of claim 1, wherein the dielectric film is exposed through the substrate and the capping layer after the word line is formed.

12. The method of claim 1, wherein the first conductive layer and the second conductive layer comprise the same material.

* * * * *